US007027340B2

(12) United States Patent
Huang

(10) Patent No.: US 7,027,340 B2
(45) Date of Patent: Apr. 11, 2006

(54) OUTPUT DEVICE FOR STATIC RANDOM ACCESS MEMORY

(75) Inventor: Chao Sheng Huang, Taipei (TW)

(73) Assignee: VIA Technologies, Inc., Taipei (TW)

( * ) Notice: Subject to any disclaimer, the term of this patent is extended or adjusted under 35 U.S.C. 154(b) by 92 days.

(21) Appl. No.: 10/898,238

(22) Filed: Jul. 26, 2004

(65) Prior Publication Data

US 2005/0093578 A1 May 5, 2005

(30) Foreign Application Priority Data

Oct. 30, 2003 (TW) .............................. 92130233 A

(51) Int. Cl.
*G01J 1/12* (2006.01)
*H03K 19/096* (2006.01)

(52) U.S. Cl. .................. 365/203; 365/230.06; 326/98; 326/95

(58) Field of Classification Search ................ 365/203, 365/230.06; 326/95, 98
See application file for complete search history.

(56) References Cited

U.S. PATENT DOCUMENTS 6,456,118 B1 * 9/2002 Beat ........................... 326/105
6,480,031 B1 * 11/2002 Keeth et al. .................. 326/95
6,703,870 B1 * 3/2004 Chung et al. ................. 327/51

* cited by examiner

*Primary Examiner*—Vibol Tan
(74) *Attorney, Agent, or Firm*—Bacon & Thomas, PLLC

(57) ABSTRACT

An output device for static random access memory is disclosed, which has a precharger, a charge and discharge path circuit, a voltage hold circuit, an output inverter and a feedback path circuit. The charge and discharge path circuit connects to a common output node and generates a potential on its output terminal in accordance with a first grounding path on or not. The voltage hold circuit controls a voltage of the common output node in accordance with both a second grounding path on or not and the potential on the output terminal of the charge and discharge path circuit. The output inverter generates and next outputs an inverted voltage on its output terminal in accordance with the potential on the output terminal of the charge and discharge path circuit. The feedback path circuit connects to output terminals of the charge and discharge path circuit and the output inverter.

9 Claims, 4 Drawing Sheets

OUTPUT DEVICE FOR STATIC RANDOM ACCESS MEMORY

BACKGROUND OF THE INVENTION

1. Field of the Invention

The present invention relates to the technical field of static random access memory (SRAM) and, more particularly, to an output device for static random access memory.

2. Description of Related Art

FIG. 1 is a schematic diagram of a typical dual ports SRAM and the output device thereof. As shown, for illustrative purpose, only one memory cell 100 is described, while others are schematically represented by dotted lines. The memory cell 100 consists of a plurality of metal oxide semiconductor (MOS) transistors and its output end has an N-type metal oxide semiconductor (NMOS) transistor MR. The transistor MR has a drain connected to node E of an output device 120, a gate connected to a control signal RWL (read word line) in order to control data of the memory cell 100 to be sent to node E or not. The output device 120 consists of P-type metal oxide semiconductor (PMOS) transistors 101, 103, 105 and 107 and NMOS transistors 102, 104 and 106.

FIG. 2 shows a timing diagram of the output device 120. As shown in FIG. 2, when data of the memory cell is to be read, node E of the output device 120 maintains at high potential for a pre-charging process. Accordingly, in T1 interval, signals PRE and RWL are at low potential, the transistor MR is in off state, and the transistor 101 is turned on such that a source of the transistor 101 connects to a voltage Vdd in order to precharge node E and further maintain the node at high potential. Next, in T2 interval, the potential of the precharge signal PRE changes from low to high, which represents that the pre-charge on node E is complete. Then, in the T3 interval, the potential of the control signal RWL changes from low to high, which turns on NMOS transistor MR. It represents that data of the memory cell 100 is sending to the output device 120. Next, after T3 interval, when data of the memory cell 100 is in high potential, node F of the memory cell 100 is in low potential, such that the transistor MP of the memory cell 100 is in off state. At this node, node E maintains at high potential due to the precharge. Therefore, the NMOS transistor 102 is turned on such that node G is at low potential. Next, in the output device 120, a high potential (the same high potential as data of the memory 100) on a terminal OUT is output through an inverter 122 consisting of MOS transistors 106 and 107. On the other hand, when data of the memory 100 is in low potential, the node F of the memory cell 100 is in high potential, and the transistor MP of the memory cell 100 is turned on. At this node, a source of the transistor MP is in a potential GND and it pulls down the potential on the node E. Thus, the potential on node E changes from high to low. Meanwhile, the PMOS transistor 103 is turned on such that node G is going to high potential. It induces a low potential (the same low potential as data of the memory cell 100) on the terminal OUT, which is output through the inverter 122 consisting of MOS transistors 106 and 107. However, as cited, node E connects to multiple memory cells so that the load of node E is heavy (indicated by a capacitor 108) and when a potential of node E changes from high to low, it needs more time to pull the potential down. This is why changing node G to high potential requires a long duration, which wastes time. Besides, the NMOS transistor 102 needs to be in the turn-on state as node E is in high potential, it will postpone the transistor 103 to pull the node G to high potential. Thus node G maintains at low potential when receiving the source potential of the MOS transistor 102, which causes the PMOS transistor 105 turned on. Therefore, a voltage Vdd is provided to node E through a source of the PMOS transistor 105, so that the potential of node E cannot quickly change from high to low and it wastes a long duration. Accordingly, a long switching time is required when data of the memory cell 100 sent is low potential.

Further, when a previous memory cell is read as low potential, node E is at low potential. Since the PMOS transistor 103 is turned on when node E is low potential, its source voltage is provided to node G so as to turn on the NMOS transistor 104. Therefore, a voltage GND is provided to node E through a source of the transistor 104. When a pre-charging is performed in T1 interval, node E is charged by the source voltage Vdd of the transistor 101 to high potential. The transistors 101, 104 function as shown in FIG. 3. The transistor 104 maintains node E at low potential, and conversely the transistor 101 maintains node E at high potential. Accordingly, a very small size is applied to the transistor 104 in design, which is much smaller than that to the transistor 101, thereby obtaining a higher driving force to achieve the precharge to node E.

However, by contrast, the very small transistor 104 has poorer driving capability. This may affect transmitting data of the memory cell 100 with low potential because when node G changes to high potential after a certain time waste and thus the NMOS transistor 104 is turned on to provide node E with its source voltage GND. The effect of speeding node E down to a low voltage is relatively reduced due to the cited poorer driving force. Thus, read speed of the memory cell cannot be increased.

Therefore, it is desirable to provide an improved output device for SRAM to mitigate and/or obviate the aforementioned problems.

SUMMARY OF THE INVENTION

The object of the present invention is to provide an output device for static random access memory (SRAM), which can speed up potential transition on nodes of the output device and further increase read speed of the memory.

To achieve the object of the present invention, the output device for SRAM essentially includes a precharger, a charge and discharge path circuit, a voltage hold circuit, an output inverter and a feedback path circuit. The SRAM has a plurality of memory cells for storing a plurality of data. The precharger has a common output node connected to a plurality of output nodes of the plurality of memory cells. When one of the memory cells is to be read, the common output node is precharged by a precharge signal to a high potential. The charge and discharge path circuit connects to the common output node and controls an internal first grounding path on or not using an inverted precharge signal, which is inverted to the precharge signal, and further generates a potential on its output terminal. The voltage hold circuit connects to both the output terminal of the charge and discharge path circuit and the common output node of the precharger, and controls a voltage of the common output node using both the potential on the output terminal of the charge and discharge path circuit and an internal second grounding path on or not that is controlled by the precharge signal. When the precharger is precharging, the second grounding path is disconnected. The output inverter generates and next outputs a inverted voltage on its output terminal in accordance with the potential on the output terminal of the charge and discharge path circuit. The feedback path circuit connects to output terminals of the charge and discharge path circuit and the output inverter for pulling down the output inverter's voltage on the output terminal when input and output terminals of the voltage hold circuit are at high potential.

Other objects, advantages, and novel features of the invention will become more apparent from the following detailed description when taken in conjunction with the accompanying drawings.

DETAILED DESCRIPTION OF THE PREFERRED EMBODIMENT

Figure 4:
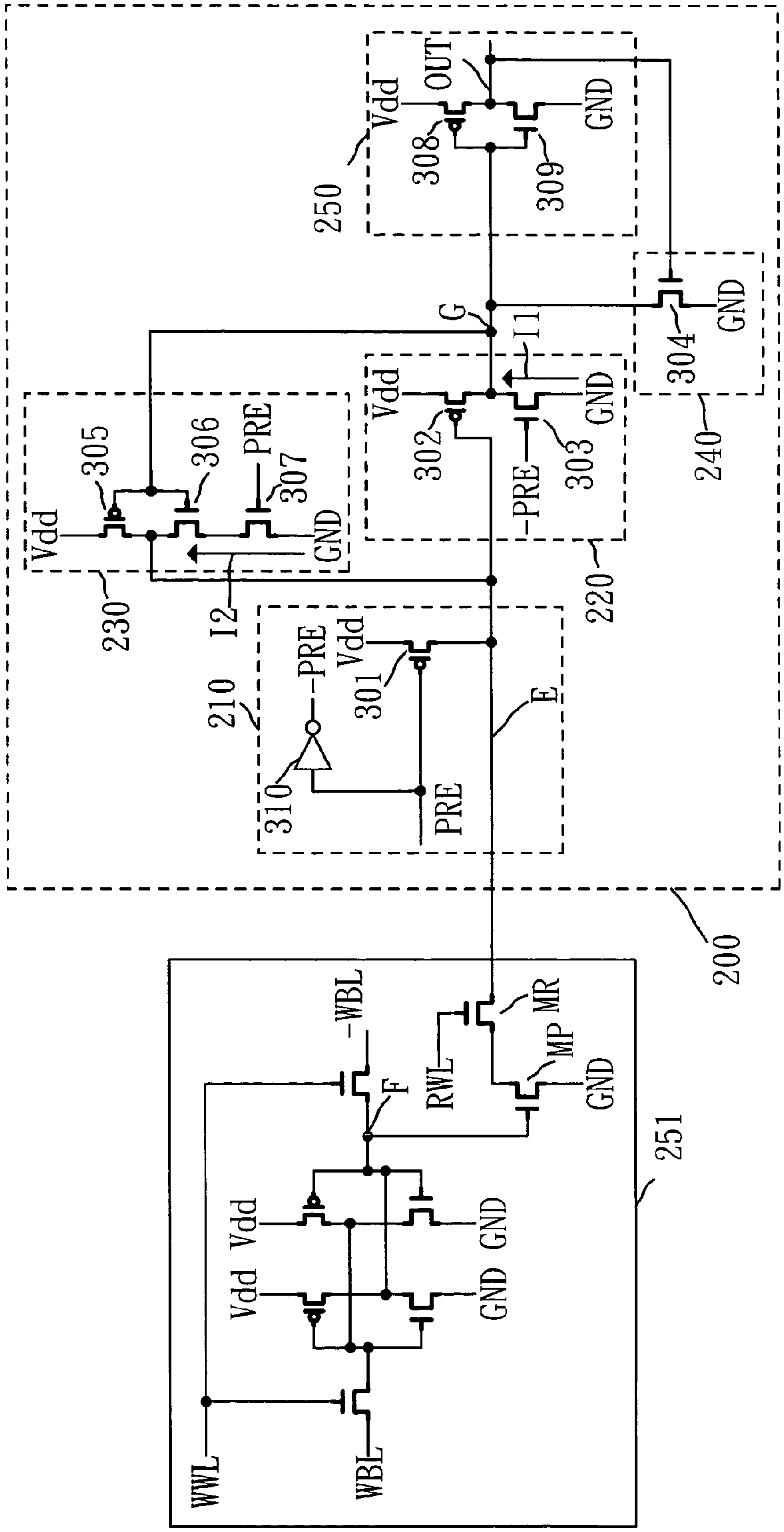
FIG. 4 is a detail circuit of an output device for SRAM in accordance with the invention.

FIG. 4 shows a preferred embodiment of a detail circuit of an output device for SRAM in accordance with the invention, wherein multiple memory cells are connected to node E, whereas only one memory cell 251 is shown for illustrative purpose. In FIG. 4, the output device 200 includes a precharger 210, a charge and discharge path circuit 220, a voltage hold circuit 230, a feedback path circuit 240 and an output inverter 250. The output inverter 250 consist of a PMOS transistor 308 and an NMOS transistor 309, which functions identically to the prior art and thus a detailed description is deemed unnecessary.

As shown, the precharger 210 consists of a first PMOS transistor 301 and an inverter 310. Before one of the memory cells is read, a precharge signal PRE goes to a low potential such that the first PMOS transistor 301 is turned on, such that a high potential Vdd connected to a drain of the first PMOS transistor 301 can precharge the node E to a high potential. An input terminal of the inverter 310 connects to the precharge signal PRE for generating an inverted precharge signal −PRE.

The charge and discharge path circuit 220 consists of a PMOS transistor 302 and an NMOS transistor 303. The transistor 302 has a gate connected to the node E, a source connected to the high potential Vdd and a drain connected to a drain of the transistor 303. The transistor 303 has a source connected to a ground voltage GND and a gate connected to the inverted precharge signal −PRE. In this case, the signal −PRE is used to control the transistor 303 on or off for controlling a first grounding path I1 active. When the first grounding path I1 is closed, the transistor 302 can completely control a potential on node G and thus the problem that the prior art cannot switch quickly on node G from low to high is eliminated.

The voltage hold circuit 230 consists of PMOS transistor 305 and NMOS transistors 306, 307. The transistor 305 has a gate connected to drains of the transistors 302 and 303 and a gate of the transistor 306, a source connected to the high potential Vdd, and a drain connected to a drain of the transistor 306 and the node E. The transistor 306 has a source connected to a drain of the transistor 307. The transistor 307 has a source connected to the ground voltage GND and a gate connected to the precharge signal PRE that controls the PMOS transistor 301 of the precharger 210. The voltage hold circuit 230 adds an NMOS transistor 307, which uses the signal PRE, as used to control the PMOS transistor 301 of the precharger 210, to control the NMOS transistor 307 on and off for further controlling a second grounding path I2 active (to impact on a potential of the node E).

Due to the inherent difference between a PMOS and an NMOS, the PMOS transistor 301 and the NMOS transistor 307 can not be active concurrently as receiving the same signal. Therefore, interference between the transistors 301 and 307 will not occur and the size design for transistors (such as, in this case, transistors 306, 307) in the voltage hold circuit 230 can be enlarged to enhance the driving capability and further speed up the switching operation.

The feedback path circuit 240 consists of a second NMOS transistor 304. The transistor 304 has a drain connected to node G, a source connected to a low potential GND and a gate connected to a terminal OUT. When the cell read out data is low potential, the signal PRE is at high potential and node E is at low potential, the PMOS transistor 302 is turned on to pull a voltage on node G to a high potential. When the cell read out data is high potential, the signal PRE maintains at high potential but node E becomes a high potential, due to high potential at the terminal OUT, the NMOS transistor 304 is turned on to pull the voltage on node G down, so the transistors 302 and 303 are in off state when the signal PRE and the node E both are at high potential, thereby avoiding floating on node G.

Figure 1:
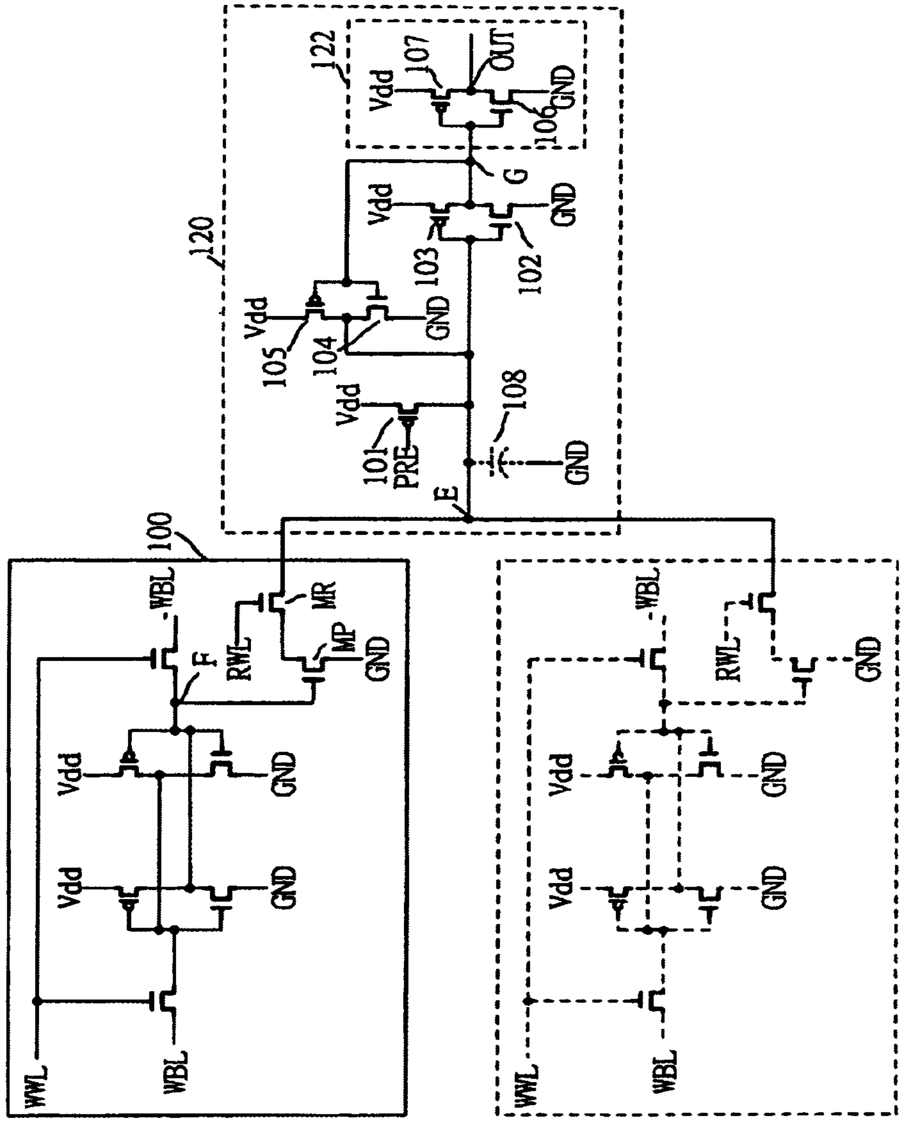
FIG. 1 is a schematic diagram of a conventional SRAM and the output device thereof.
Figure 2:
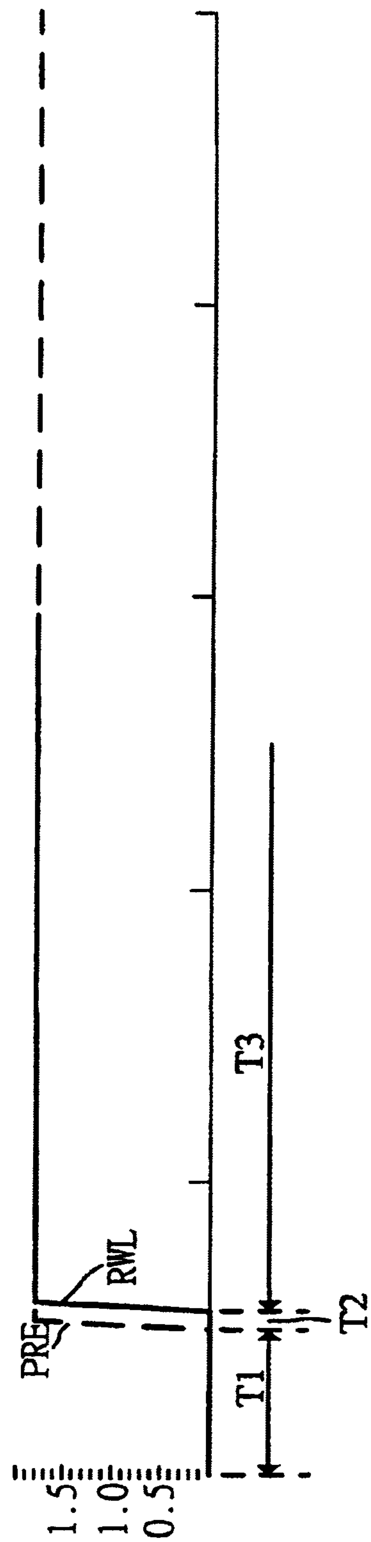
FIG. 2 is a timing diagram of FIG. 1.
Figure 3:
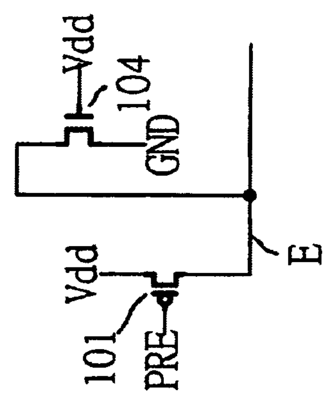
FIG. 3 is an equivalent schematic diagram of FIG. 1.
Figure 5:
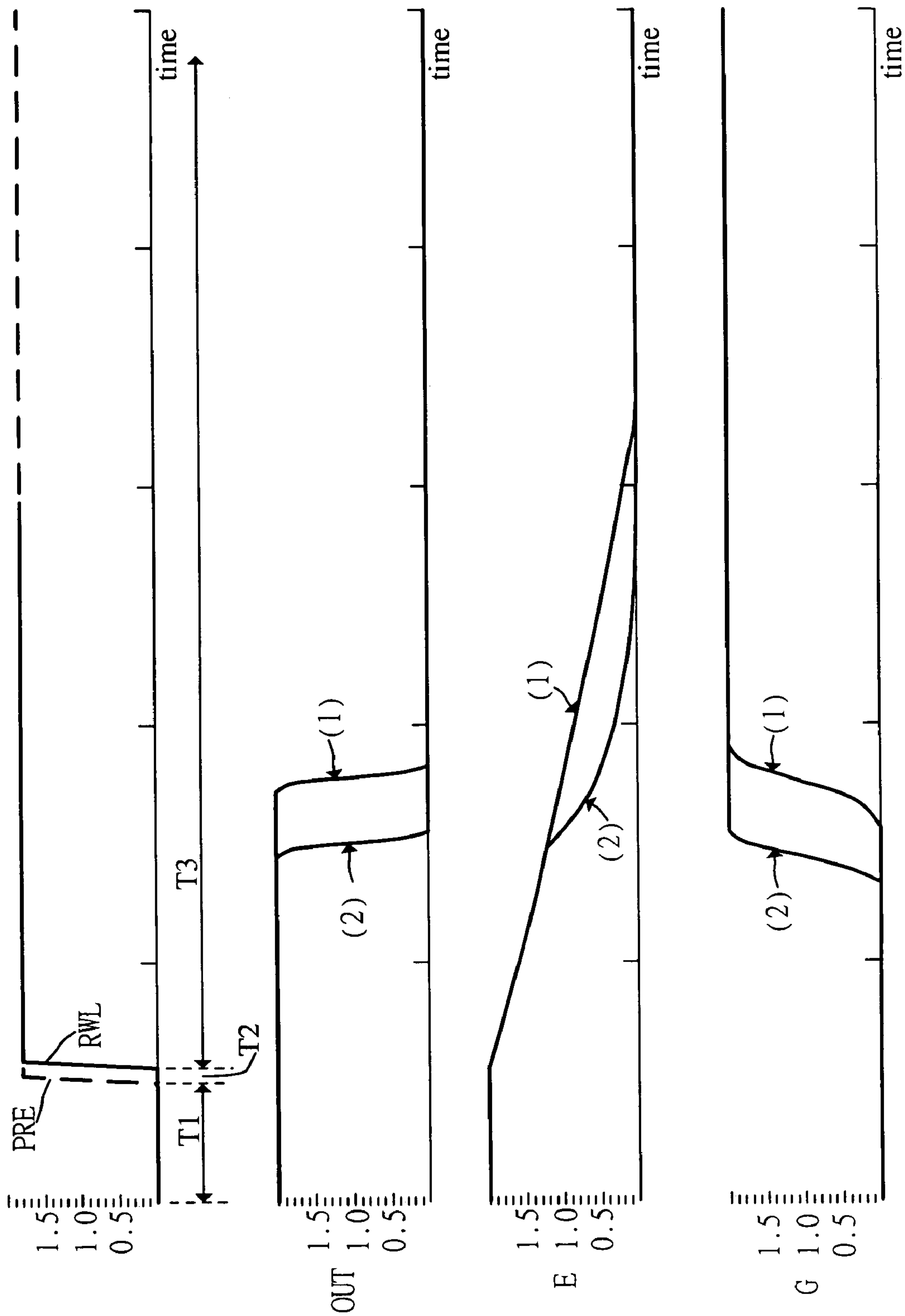
FIG. 5 is a simulated timing diagram of FIG. 4.

Next, a read timing diagram of FIG. 4 is described in FIG. 5 as an operation example of the output device 200. The output device 200 can be operable at an input voltage ranging between 0–1.8V, for example. As shown, in T1 interval, the output device 200 is pre-charging such that the signal PRE is at low potential to turn on the PMOS transistor 301 of the precharger 210. Meanwhile, a source voltage Vdd of the PMOS transistor 301 precharges node E to a high potential. The PMOS transistor 302 is turned on if node E is at low potential before precharged to a high potential, thus the PMOS transistor 302 provides node G with the source voltage Vdd for turning the NMOS transistor 306 on. At this moment, the NMOS transistor 307 cannot be active because of the low-potential precharge signal PRE and the second grounding path I2 is closed. As aforementioned, interaction between two transistors of FIG. 3 (i.e., transistors 301 and 306 in this embodiment) to the node E does not occur and thus the size limit of the transistor 306 smaller than the transistor 301 is not required, and accordingly the driving capability is enhanced, and the switching operation becomes quicker in T3 interval.

In T2 interval, the signal PRE is at high potential which represents that node E is precharged completely when its potential is at high. In T3 interval, it represents that the memory cell 251 starts sending the data to the output device 200 when the control signal RWL changes from low to high and NMOS transistor MR is turned on.

If data stored in the memory cell 251 is a high potential (not shown in FIG. 5) and node F is at low potential, MR is in on state and MP is in off state. Thus, node E maintains at high potential to cause the transistor 302 to be in off state. Also, the transistor 303 is turned off due to the inverted precharge signal −PRE. However, due to the inverted precharge signal −PRE being in high potential in T1 interval, node G is at high potential to cause the NMOS transistor 303 to be turned on, which provides the first grounding path I1 to maintain G at low potential and further output a high potential at the terminal OUT through an inverter 250. Next, the high potential at the terminal OUT is fed back to the feedback path circuit 240 for turning on the transistor 304. Thus, a source voltage GND of the transistor 304 is provided to node G for avoiding floating by maintaining node G at low potential and accordingly stabilizing the output of the terminal OUT at high potential.

On the contrary, if data stored in the memory cell 251 is low potential (i.e., node E from high potential to low potential in FIG. 5), node F is at high potential, the transistors MR, MP are turned on. When T1 interval changes to T2 interval, the inverted signal –PRE changes from high potential to low potential to disconnect the grounding path I1 consisting of the transistor 303. Thus, the voltage on node G cannot be maintained at low potential because the transistor 303 is off, and the transistor 302 is turned on and starts providing node G with high potential. The transistor 302 provides node G with high potential such that the OUT terminal is at low potential. It causes that the transistor 304 of the feedback path circuit 240 is turned off and does not act on node G. Also, the transistor 306 is turned on and further the NMOS transistor 307 is turned on by the precharge signal PRE with high potential. As aforementioned, sizes of the transistors 306 and 307 will not be limited by a size of the PMOS 301 and thus a configuration with higher driving capability can be designed. Accordingly, a graph of FIG. 5 shows that the voltage change on node E in a curve changes from curve (1) to curve (2), which illustrates that curve (2) has shorter switching time than curve (1) as comparing voltage change at G and OUT under node E active.

In view of foregoing, it is known that in T1 interval, because the NMOS transistor 307 is added in the voltage hold circuit, which has active time different from the precharger, no interference occurs. Therefore, the precharger can precharge node E to a high potential quickly. In T3 period, the NMOS transistor 303 of the charge and discharge path circuit turns off the first grounding path I1 and the voltage hold circuit can be designed as large-size transistor for driving in order to speed up node E to a low potential and accordingly increase read speed of the memory cell.

Although the present invention has been explained in relation to its preferred embodiment, it is to be understood that many other possible modifications and variations can be made without departing from the spirit and scope of the invention as hereinafter claimed.

What is claimed is:

1. An output device for static random access memory (SRAM), the SRAM having a plurality of memory cells to store a plurality of data, the output device comprising:

a precharger having a common output node connected to a plurality of output nodes of the plurality of memory cells, which precharges the common output node to a high potential by a precharge signal when one of the memory cells is to be read;

a charge and discharge path circuit connected to the common output node, which generates a potential of an output terminal of the charge and discharge path circuit in accordance with an internal first grounding path on or not that is controlled by an inverted precharge signal;

a voltage hold circuit connected to the common output node and the output terminal of the charge and discharge path circuit, which controls a voltage of the common output node in accordance with the potential of the output terminal of the charge and discharge path circuit and an internal second grounding path on or not that is controlled by the precharge signal, and closes the second grounding path when the precharger is precharging;

an output inverter, which generates an inverted voltage on its output terminal to output in accordance with the potential of the output terminal of the charge and discharge path circuit; and a feedback path circuit connected to the output terminals of the charge and discharge path circuit and the output inverter.

2. The output device as claimed in claim 1, wherein the precharger consists of a first PMOS transistor and precharges the common output node to a high potential when one of the memory cells is to be read and the first PMOS transistor is turned on by the precharge signal.

3. The output device as claimed in claim 2, wherein the precharger further comprises an inverter with an input terminal connected to the precharge signal in order to generate the inverted precharge signal to output.

4. The output device as claimed in claim 1, wherein the charge and discharge path circuit is formed by connecting a second PMOS transistor and a first NMOS transistor in series, and the first NMOS transistor forms the first grounding path.

5. The output device as claimed in claim 4, wherein the inverted precharge signal controls the first NMOS transistor on or not to thus determine the first grounding path on or not.

6. The output device as claimed in claim 1, wherein the feedback path circuit consists of a second NMOS transistor with a drain connected to the output terminal of the charge and discharge path circuit, a gate connected to the output terminal of the output inverter and a source connected to a ground potential, thereby avoiding floating of the output terminal of the charge and discharge path circuit.

7. The output device as claimed in claim 1, wherein the voltage hold circuit is formed by connecting a third PMOS transistor, a third NMOS transistor and a fourth NMOS transistor in series, and the second grounding path consists of the third NMOS transistor and the fourth NMOS transistor.

8. The output device as claimed in claim 7, wherein the precharge signal controls the fourth NMOS transistor on or not to thus determine the second grounding path on or not.

9. The output device as claimed in claim 1, wherein the output inverter, which generates the inverted voltage to output in accordance with the potential of the output terminal of the charge and discharge path circuit, is formed by connecting a fourth PMOS transistor and a fifth NMOS transistor in series.

* * * * *